United States Patent [19]

Hermann et al.

[11] 4,065,684
[45] Dec. 27, 1977

[54] PIEZOELECTRIC RESONATOR FOR TIMEPIECES AND METHOD FOR MAKING SAME

[75] Inventors: Jean Hermann, Neuchatel; Hubert Choffat, St. Blaise, both of Switzerland

[73] Assignee: Centre Electronique Horloger S.A., Neuchatel, Switzerland

[21] Appl. No.: 601,634

[22] Filed: Aug. 4, 1975

[30] Foreign Application Priority Data

Aug. 7, 1974 Switzerland .................. 10835/74

[51] Int. Cl.² .................................................. H01L 41/04
[52] U.S. Cl. ........................................... 310/351; 310/367
[58] Field of Search ............... 310/8.2, 9.1, 9.4, 9.5, 310/9.6

[56] References Cited

U.S. PATENT DOCUMENTS

| 3,221,189 | 11/1965 | Brandt et al. ............... 310/9.4 X |
| 3,735,166 | 5/1973 | Bradley ...................... 310/9.4 |
| 3,805,098 | 4/1974 | Carpenter et al. .......... 310/9.4 X |
| 4,025,806 | 5/1977 | Weber ......................... 310/9.4 |
| 4,027,181 | 5/1977 | Moreillon et al. .......... 310/9.4 |

FOREIGN PATENT DOCUMENTS

| 1,297,690 | 6/1969 | Germany ..................... 310/9.4 |
| 578,955 | 7/1946 | United Kingdom .......... 310/9.4 |

Primary Examiner—Mark O. Budd
Attorney, Agent, or Firm—Young & Thompson

[57] ABSTRACT

A piezoelectric resonator, particularly for electronic wrist watches, comprises an elongated piezoelectric crystal rod that oscillates in length-extension. Opposite faces of the rod are partially metallized; and short wires are secured tangentially to these metallized surfaces midway of the length of the rod. The wires extend perpendicular to the length of the rod and are secured at their other ends to metallized opposite surfaces of an elongated ceramic support which is parallel to and of about the same size and shape as the rod. The support also has metallized end faces which are secured to the inner ends of support wires that pass through a casing in sealed relationship and mount the support and rod in spaced relation from the casing.

3 Claims, 2 Drawing Figures

PIEZOELECTRIC RESONATOR FOR TIMEPIECES AND METHOD FOR MAKING SAME

GENERAL FIELD OF THE INVENTION

The present invention relates to piezoelectric resonators for timepieces, for example for electronic wrist watches, these resonators being also useful in other applications for miniaturized oscillating circuits.

DISCUSSION OF THE PRIOR ART

It is already known to provide piezoelectric crystal resonators comprising a crystal rod, generally of quartz, which oscillates in flexure at relatively low frequency. The crystal is supported by four suspension wires connected to metallized surfaces of the rod in the vicinity of the two nodal axes and which extend through the wall of an evacuated casing at appropriate wire feedthroughs.

one of the drawbacks of resonators that oscillate in flexure is that the reduction of their dimensions is limited by the minimum distance that must be maintained between the nodal axes of the crystal, in order to provide sufficient clearance between the suspension wires connected to the metallized faces of the piezoelectric rod.

Another drawback is due to their high sensitivity to mechanical and thermal stresses that arise in the course of manufacture and subsequently to shocks occuring during their use. In particular, the suspension wires of the quartz rod are relatively long and do not confer sufficient rigidity on the suspension of the crystal, which may give rise to variations in the frequency of oscillation of the resonator under the influence of shocks.

In known resonators, the quartz rod is metallized over a large part of the opposed faces onto which the suspension wires are secured. The motional capacitance of such a resonator (series capacitance in the equivalent circuit) is relatively large, which gives rise to problems in the associated electronic circuit. Moreover, the aging of the resonator is accelerated by deterioration of the metallized layer.

By virtue of their complicated structure, their cost of fabrication is relatively high, which also limits their applications and their use. Finally, the steps needed to adjust the frequency are complicated and contribute in a substantial proportion to the manufacturing cost.

OBJECTS OF THE INVENTION

An object of the present invention is to overcome the drawbacks of the prior art with reference to piezoelectric resonators and to provide a piezoelectric resonator which can be of substantially reduced dimensions, which is practically not affected by the mechanical and thermal stresses occurring in the course of manufacturing and usage, which can be manufactured at relatively low cost and has excellent properties such as long life, reduced aging effects and small motional capacitance.

The piezoelectric resonator of the present invention comprises a piezoelectric crystal rod which oscillates in length-extension suspended for example in the interior of a casing, the suspension means comprising two conductive straight wires disposed perpendicular to the length of the crystal rod and secured at one end of the wire tangentially to the middle of two opposite at least partially metallized faces of the rod.

According to a preferred embodiment, the piezoelectric resonator is attached to a support mounted on the interior of a casing and partially metallized on the lateral faces on which the suuspension wires are secured by their other ends. The casing comprises a base having two glass-metal feedthroughs, and a cover that fits on the base. Two connecting wires are fixed to the support and maintain the same at a predetermined distance from the base of the casing.

The suspension wires are short relative to the length of the crystal rod. The support comprises a ceramic plate having about the size and shape of the crystal rod. It comprises a metallized zone on each lateral face defining two conductive paths between the connection wires and the suspension wires.

To make the above described piezoelectric resonator, the two opposed faces of the crystal are metallized under vacuum and through a mask, and one end of the suspension wires is soldered on the metallized faces. Preferably the suspension wires are first soldered on the support, and then the suspension wires are adjusted to a predetermmined length. This assembly is positioned in the casing and is secured to the connecting wires, and then the crystal rod is secured in place, and the base of the casing is covered by the cover and the two parts are assembled under a controlled atmosphere by cold welding.

Other objects, features and advantages of the present invention will become apparent from a consideration of the following description, taken in connection with the accompanying drawings, which show one embodiment of the piezoelectric resonator according to the invention.

Figure 1:
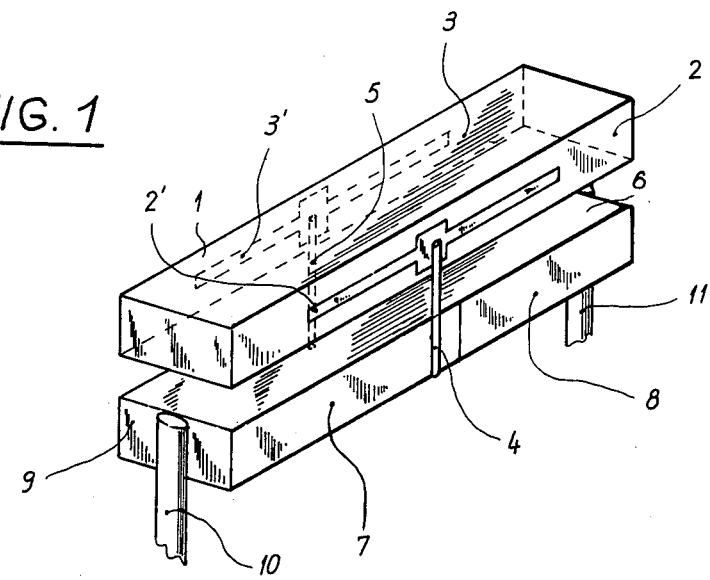
FIG. 1 is a perspective view of a piezoelectric crystal rod mounted on its support.
Figure 2:
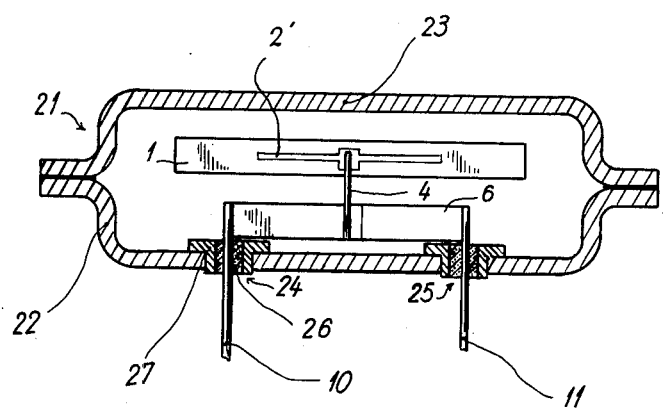
FIG. 2 is a cross-sectional view of the piezoelectric resonator after encapsulation.

Referring now to the drawing in greater detail, and first to FIG. 1 thereof, there is shown a piezoelectric crystal rod 1 which is partially metallized on its opposite faces 2 and 3, which appear as opposite side faces in FIG. 1, the face 2 being visible and the face 3 being parallel and opposite to the face 2. Metallic layers 2', 3' are applied through a mask, by any known metallizing process, and occupy a relatively small portion of the total surface of the faces 2 and 3. At the middle of each elongated metal layer 2', 3', there is an enlarged zone onto which suspension wires 4, 5 are soldered tangentially, the other ends of which are attached to a ceramic support 6.

Support 6, whose size and shape is about that of the crystal rod 1, is partially metallized on its lateral faces. The first metallized zone 7 covers partially one of the long side faces 8 of the support 6 from one end to beyond its mid-point and also covers the short side face 9 of the support to define a conductive path from the lower end of the suspension wire 4 to the upper end of the connection wire 10.

In the same manner, the symmetrical but opposite side faces of the support 6 are metallized to define a conductive path from the lower end of the suspeension wire 5 to the upper end of the connection wire 11.

FIG. 22 is a cross-sectional view of a piezoelectric resonator comprising a casing 21 which a base 22 and a cover 23 assembled by cold welding in a conventional manner. Base 22 is provided with two feedthroughs 24, 25 for the connecting wires 10 and 11. The feedthroughs include cylindrical glass members 26 fixed in metallic rings 27.

The piezoelectric resonator of the type described above is preferably assembled as follows:

First the two opposite faces 2, 3 of the crystal rod 1 are metallized under vacuum through a suitably shaped mask, by any known conventional method, thereby to produce the layers 2', 3' thereon. The layers forming the zone 7 and the corresponding zone on the opposite side faces, are also applied to the ceramic support 6. The lower end of the suspension wire 4 is soldered to the center of the face 8 of support 6, while the wire 5 is correspondingly soldered to the opposite face. The suspension wires 4, 5 are then cut to their predetermined lengths and the support 6 is positioned in the base 22 of the casing 21 which has previously been provided with the feedthroughs 24 and 25. The wires 10 and 11 are then soldered to the short side faces of the support 6. Then the crystal is positioned between the suspension wires 4, 5, the upper ends of which are soldered to the enlarged zones of the metallized layers 2' and 3'. Finally the base 22 is covered with the cover 23 and 22 and 23 are cold welded together along their mating flanges in an inert atmosphere.

Of course the sequence of certain of these operations is not critical. For example, the suspension wires 4 and 5 may be soldered simultaneously to the crystal rod 1 and the support 6 which have been first metallized. The assembly thus obtained is placed within the base 22 of the casing 21 previously provided with wires 10 and 11 extending in sealed relation through the feedthroughs 24 and 25, and the upper ends of the wires 10 and 11 are soldered to the short side faces of the support 6.

For mass production, a plurality of crystal rods and supports may be simultaneously metallized. The advantges of the resonator and the process for making the same, described above, result on the one hand from the choice of a rod that oscillates in length-extension and, on the other hand, from the structure selected for the suspension and support thereof. The choice of a quartz rod that oscillates in length-extension permits to provide for only partial metallization of two opposite faces, to obtain an intrinsic coupling factor higher than for quartz that oscillates in flexure, and a small motional capacitance as required by the associated oscillator circuit, to render unimportant the tolerances of the dimensions of the rod other than that of its length, by virtue of the fact that the oscillation frequency is controlled substantially by the length of the rod, and finally to suppress the need for adjusting the frequency, the tolerances of the frequency being quite large.

The fact that the suspension and connection wires are straight imparts good shock resistance to the resonator.

The stresses which occur in the suspension wires and in the points where the same are connected to the crystal rod and which are due to the oscillating movement of the resonator are closely related to he stored energy and the distribution thereof in those parts under stress. As this energy is relatively small in the present embodiment, the aging effects are reduced and the quality factor is greatly improved.

The suspension arrangement and the mounting of the crystal on a support which is in turn mounted on two connection wires, considerably reduces the effects of temperature varations of the casing and the effects due to mechanical and thermal stresses imparted to the device, which makes the same easy to assemble and permits cold welding of the housing. Accordingly, the fabrication of the device is relatively inexpensive and well adapted to mass production.

From a consideration of the foregoing disclosure, therefore, it will be evident that the initially recited objects of the present invention have been achieved.

Although the present invention has been described and illustrated in connection with a preferred embodiment, it is to be understood that modifications and variations may be resorted to without departing from the spirit of the invention, as those skilled in this art will readily understand. Such modifications and variations are considered to be within the purview and scope of the present invention as defined by the appended claims.

What is claimed is:

1. A piezoelectric resonator comprising an elongated piezoelectric crystal rod that oscillates in length-extension, a casing within which said rod is disposed and a first pair of conductive wires secured tangentially to the middle of opposite long faces of the rod and extending perpendicular to the length of the rod, the wires supporting the rod in the casing being straight and of a length substantially less than the length of the crystal rod, the faces of the rod to which the wires are secured being partially metallized, a support constituted by an elongted piece of ceramic material of about the same size and shape as and parallel to the crystal rod, said wires of the said first pair of wires being secured at their one ends to said support and at their other ends to said crystal rod, and a second pair of conductive wires secured to the ends of the support and supporting the support and rod in the casing, the last-named wires extending in sealed relationship through the casing to the exterior of the casing, the side faces of the support being metallized on the one hand between one wire of the first pair of wires and one wire of the second pair of wires, and on the other hand between the other wire of the first pair of wires and the other wire of the second pair of wires thereby to complete electrically conductive paths between the metallized area on one side of the rod and one of the wires of the second pair of wires, and the metallized area on the other side of the rod and the other wire of the second pair of wires.

2. A resonator as claimed in claim 1, the second pair of wires supporting said support in spaced relation from the casing.

3. A resonator as claimed in claim 1, said metallized parts of the opposite faces of the crystal rod having each a surface substantially less than the surface of said faces.

* * * * *